US008751905B2

(12) United States Patent
Nemazie

(10) Patent No.: US 8,751,905 B2
(45) Date of Patent: Jun. 10, 2014

(54) MEMORY WITH ON-CHIP ERROR CORRECTION

(75) Inventor: Siamack Nemazie, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 171 days.

(21) Appl. No.: 13/351,179

(22) Filed: Jan. 16, 2012

(65) Prior Publication Data

US 2013/0073926 A1    Mar. 21, 2013

Related U.S. Application Data

(63) Continuation-in-part of application No. 13/303,947, filed on Nov. 23, 2011, and a continuation-in-part of application No. 13/235,294, filed on Sep. 16, 2011.

(60) Provisional application No. 61/540,457, filed on Sep. 28, 2011.

(51) Int. Cl.
*G11C 29/00* (2006.01)

(52) U.S. Cl.
USPC ............................ 714/773; 714/769; 714/755

(58) Field of Classification Search
USPC .......... 714/773, 752, 755, 769, 709, 756, 763
See application file for complete search history.

(56) References Cited

U.S. PATENT DOCUMENTS

| 3,814,921 | A | | 6/1974 | Nibby et al. |
| 4,204,634 | A | * | 5/1980 | Barsuhn et al. ............... 714/779 |
| 4,712,216 | A | | 12/1987 | Glaise |
| 4,884,271 | A | | 11/1989 | Concha et al. |
| 5,313,475 | A | | 5/1994 | Cromer et al. |
| 5,664,156 | A | * | 9/1997 | Wang et al. ..................... 703/23 |
| 6,047,112 | A | * | 4/2000 | Wise et al. ....................... 714/1 |
| 6,526,537 | B2 | | 2/2003 | Kishino |
| 7,149,950 | B2 | * | 12/2006 | Spencer et al. ............... 714/763 |
| 7,447,948 | B2 | | 11/2008 | Galbi et al. |
| 7,810,016 | B2 | | 10/2010 | Takahashi |
| 2008/0016392 | A1 | | 1/2008 | Earl et al. |

* cited by examiner

*Primary Examiner* — Fritz Alphonse
(74) *Attorney, Agent, or Firm* — Maryam Imam; IPxLAW Group LLP

(57) ABSTRACT

A memory device is configured to correct errors in codewords written to a memory array. Errors, if any, in a first codeword are corrected and a codeword corrector output is generated including a corrected first codeword. A data buffer receives the codeword corrector output and a first user data associated with the addressed page and generates a data buffer output including the corrected first codeword, as modified by the first user data, defined as a first codeword output. A codeword encoder receives the data buffer output and encodes the first codeword output to generate an encoded first codeword output included in a codeword encoder output. A write buffer receives the codeword encoder output and saves the same for writing to the memory array. Writing to the memory array is performed while receiving a second user data, which has a second codeword associated therewith, and correcting the second codeword.

15 Claims, 8 Drawing Sheets

Burst Read and Burst read crossing codeword boundary

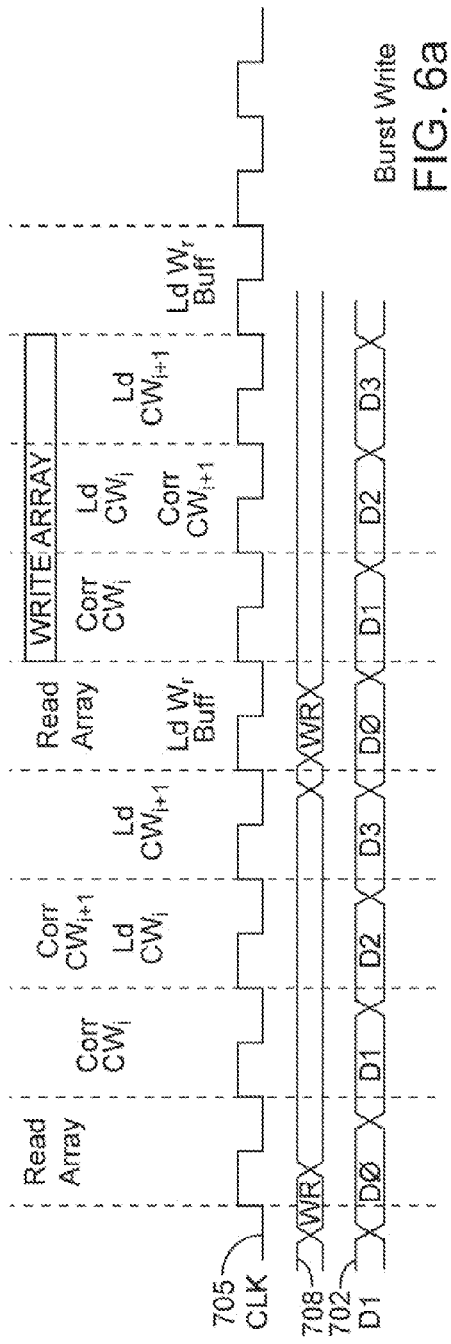
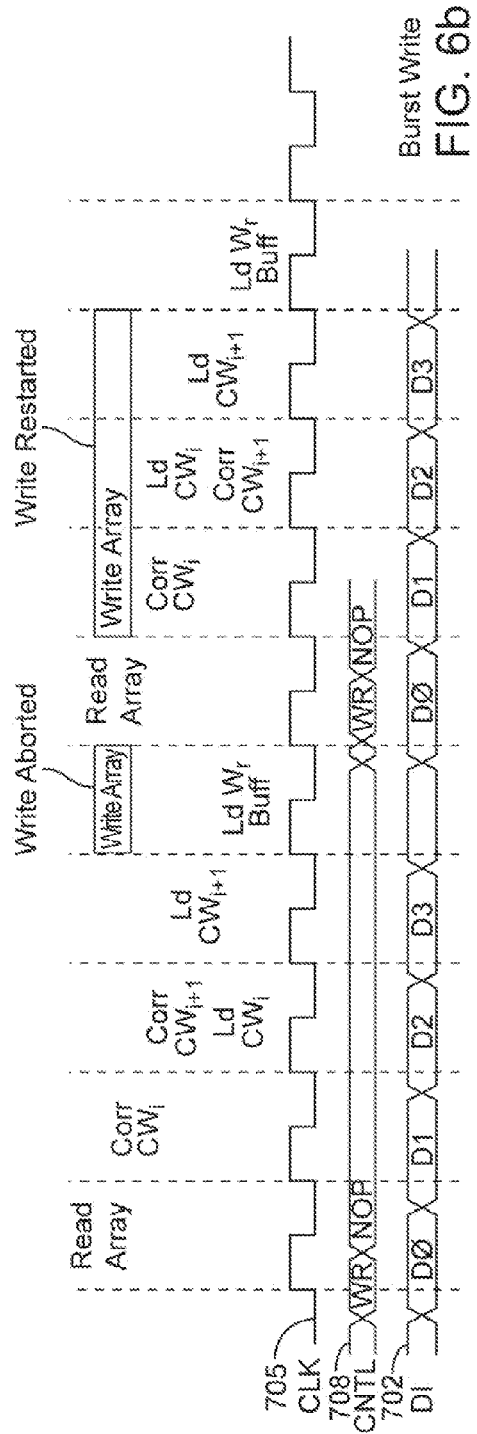

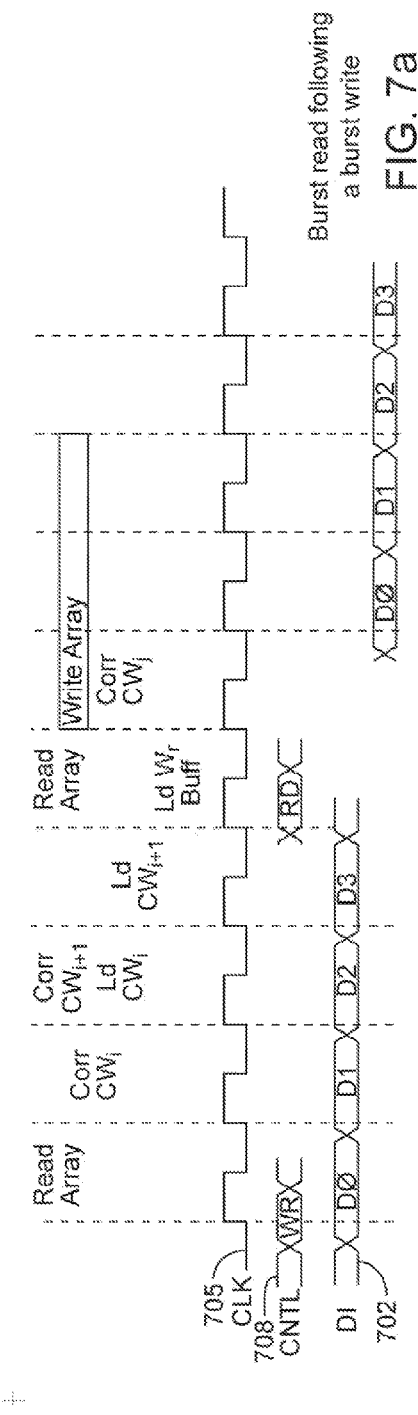
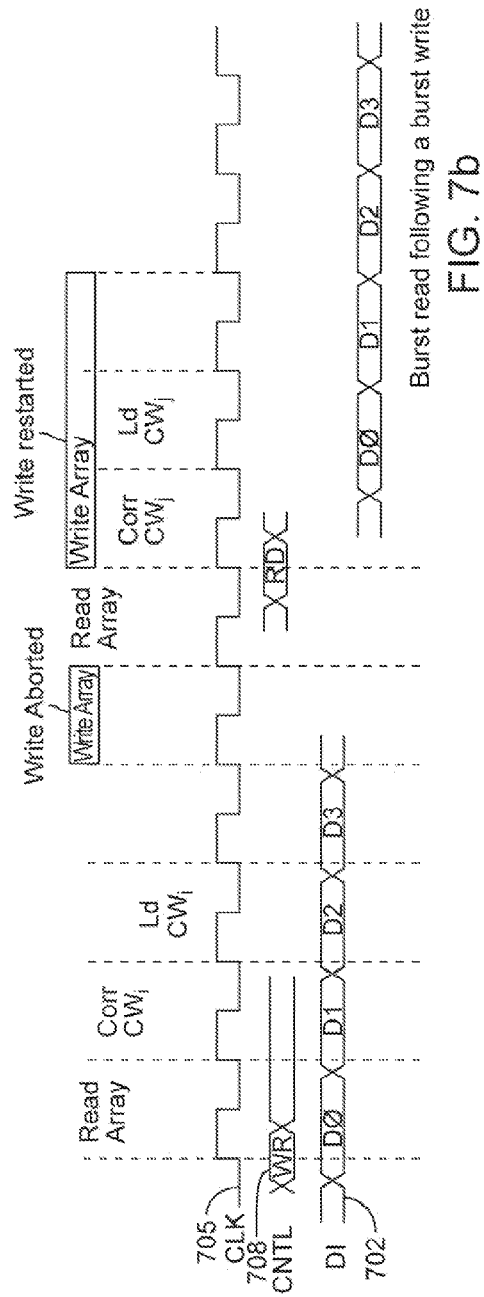
FIG. 7a Burst read following a burst write
FIG. 7b Burst read following a burst write

MEMORY WITH ON-CHIP ERROR CORRECTION

CROSS REFERENCE TO RELATED APPLICATIONS

This application claims priority to U.S. Provisional Patent Application No. 61/540,457 filed on Sep. 28, 2011 and is a continuation-in-part of U.S. patent application Ser. No. 13/303,947, filed on Nov. 23, 2011, by Siamack Nemazie, and entitled "MAGNETIC RANDOM ACCESS MEMORY WITH DYNAMIC RANDOM ACCESS MEMORY (DRAM)-LIKE INTERFACE", incorporated herein by reference as though set forth in full and a continuation-in-part of U.S. patent application Ser. No. 13/235,294, filed on Sep. 16, 2011, by Siamack Nemazie, and entitled "MAGNETIC RANDOM ACCESS MEMORY WITH BURST ACCESS", incorporated herein by reference as though set forth in full.

BACKGROUND OF THE INVENTION

1. Field of the Invention

The invention relates to write and read operations of a memory device and particularly to write and read operations using error-correcting code (ECC) to correct errors during read and write operations.

2. Description of the Prior Art

On-chip error-correcting code has been used in memory devices for some time. Typically, such systematic ECC requires appending redundancy (also known as "parity" or "overhead") to the data that is intended to be stored in the memory device. The concatenation of such data and parity is commonly referred to as a "codeword". A data unit size refers to a size of the data that is stored in and/or read from the memory device by the user as a single unit. Examples of such data unit is a 32-bit data unit or a 64-bit data unit. Data size refers to size of the data portion of the codeword. Codeword size refers to size of the codeword Generally, for a given ECC, such as single error correction, or double error detection an example of which is SEC-DED, a larger data size results in higher a code rate or less overhead. For example for a single error correction, double error detection (SEC-DED) ECC, a 32-bit data size, the SEC-DED requires 7 bits of redundancy resulting in a codeword having 21.8% overhead and a 64-bit data size requires 8 bits of redundancy (12.5% overhead), a 120-bit data size requires 8 bits of redundancy a 128-bit data size requires 9 bits of redundancy (7% over head) and a 256-bit data size requires 10 bits of redundancy (3.9% overhead).

To reduce the overhead of ECC, which increases the code rate, for a given ECC code, the data size (also referred to as "k") the largest data size that meets the reliability requirements. In the above example, assuming all 4 data sizes meet reliability requirements, the code with a 256-bit data size is selected. The data unit size, the size of a unit of access to the memory device, is typically 8 or 16 or 32 bits. The unit of read access from the memory device is referred to herein as the "array read size". The unit of write access to the memory device is referred to herein as the "array write size".

In some prior art memory systems, the data unit size is the same as the data size. However, these prior art systems suffer from having a small data size with an overhead that is large. For example, a 32-bit data size has a codeword whose overhead makes up 21.8% of the codeword with SEC-DED.

In summary, prior art systems suffer from either having large data sizes that require numerous input/output pins therefore increasing the chip size and power consumption or compromise reliability by using inadequate overhead.

What is needed is a method and apparatus for reliability reading and writing to a memory device using ECC while maintaining low power consumption.

SUMMARY OF THE INVENTION

Briefly, an embodiment of the invention includes a memory device configured to correct errors. The memory device includes a data latch responsive to an addressed page of data from a memory array generates a data latch output. Further, a codeword corrector receives the data latch output, which includes a first codeword, the codeword corrector corrects errors, if any, in the first codeword and generates a codeword corrector output including a corrected first codeword. A data buffer receives the codeword corrector output and a first user data associated with the addressed page and provided by a user of the memory device and generates a data buffer output including the corrected first codeword, as modified by the first user data, defined as a first codeword output. Further, a codeword encoder receives the data buffer output and encodes the first codeword output to generate an encoded first codeword output included in a codeword encoder output. A write buffer receives the codeword encoder output and saves the same to provide a write data to the memory array. Writing of the write data to the memory array is performed while receiving a second user data, the second user data having a second codeword associated therewith, and correcting the second codeword.

These and other objects and advantages of the invention will no doubt become apparent to those skilled in the art after having read the following detailed description of the various embodiments illustrated in the several figures of the drawing.

IN THE DRAWINGS

FIG. 6a shows a timing diagram of bust write and burst write following a burst write FIG. 6b shows a timing diagram of bust write and burst write following a burst write where write to array is interrupted FIG. 7a shows a timing diagram of a bust read following a burst write FIG. 7b shows a timing diagram of a burst write following a burst write where write to array is interrupted.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
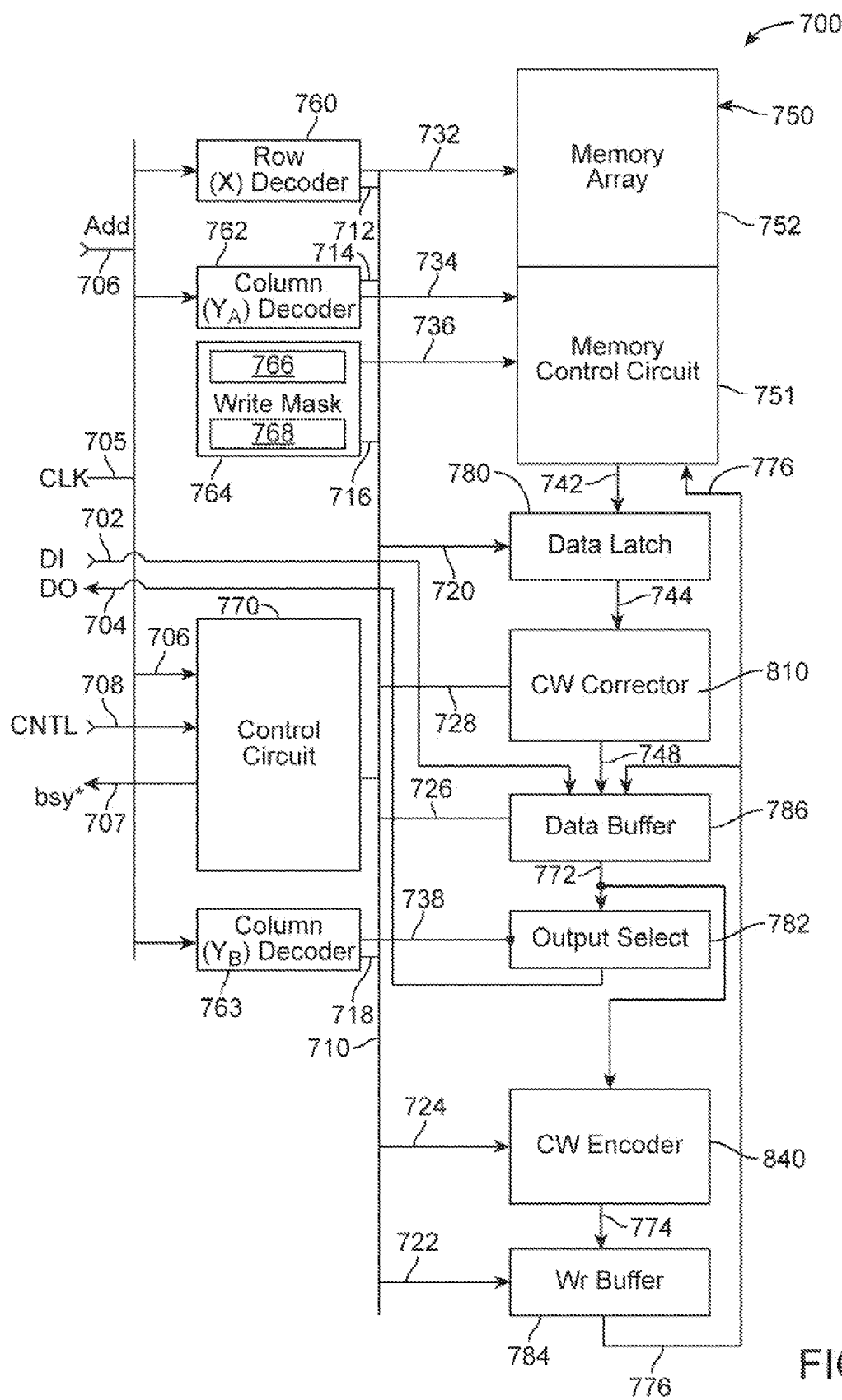
FIG. 1 shows a block diagram of memory device 700, in accordance with an embodiment of the invention.

FIG. 1 shows a block diagram of a memory device 700, in accordance with an embodiment of the invention. The device 700 is shown to include a memory unit 750, a row decoder 760, a column decoder 762, a mask register 764, a column decoder 763, a control circuit 770, a data latch 780, a codeword corrector 810, a data buffer 786, an output select 782, a codeword encoder 840, and a write buffer 784. The mask register 764 is shown to include a write mask register 766 and an auxiliary write mask register 768.

The unit 750 may be any kind of memory, such as but not limited to magnetic memory, for example, magnetic random access memory (MRAM), such as spin torque transfer (STT-MRAM). The memory unit 750 is shown to include a memory array 752 and a memory array access circuitry 751. In cases where the unit 750 is made of MRAM or STTMRAM, the array 752 is made of MRAM or STTMRAM cells. As known to those in the field, the array 752, is made of columns and rows of memory cells that are locations used for saving data units, and serves to store information provided through the DI 702, and the control circuit 770 controls the rows and address for reading and writing information to the array 752.

The input to the device 700 is shown to be a clock, CLK 705, an address bus Add 706, a data in bus DI 702 (also referred to herein as "input data"), and a control CNTL 708. A busy signal 707 is some times referred to herein as "bsy*" and is optionally provided by the device 700 as output. The data out bus DO 704 also is an output generated by the device 700.

Further, the device 700 may be formed on a single integrated circuit (ICs) or span multiple ICs or partially formed on one or more ICs and partially formed externally to the ICs. The address bus 706 is shown coupled to the control circuit 770, the row decoder 760, column decoder 762, and the column decoder 763, and provide an address identifying a location in the unit 750 to which a write or a read operation is performed.

The control circuit 770 is shown to receive control signals 708, the bus 706, and output the busy signal 707. The control circuit 770 is also shown to receive the clock, CLK 705, and to be coupled to a bus 710, which is shown coupled to the register 764, the column decoder 762, the column decoder 763, the row decoder 760, the data latch 780, the write buffer 784, the CW encoder 840, and the CW corrector 810. The data latch 780 is shown to receive memory unit data output 742 (also known herein as "memory unit read data") and control 720 and to generate the data latch output 744 to the CW corrector 810. The CW corrector 810 also receives as input the CW corrector control 728, which is a part of the bus 710 and generates the CW corrector output 748 to the data buffer 786. The data buffer 786 is shown to also receive the DI 702 and the control 726, which is a part of the bus 710. Further, the data buffer 786 is shown to receive output 776 (also known herein as "memory unit write data" or "write data"), which is also provided as input to the unit 750. The data buffer 786 is shown to generate the data buffer output 772 to the output selection 782, which also receives as input the column decoder 738 and generates the DO 704. The data buffer output 772 is also provided as input to the CW encoder 840. The CW encoder 840 is shown to receive the output 772 in addition to the control 724, which is part of the bus 710, and is shown to generate the CW encoder output 774 to the write buffer 784.

The write buffer 784 is shown to further receive as input the control 722, which is a part of the bus 710, and to generate the write buffer output 776 to memory unit 750 and data buffer 786.

The output of the data latch 780, i.e. data latch output 744 is also referred to herein as "latched data burst".

The row decoder 760 is shown coupled to output the row decoder output 732 to the unit 750. The decoder 762 is shown coupled to the unit 750 through the column decoder output 734 and the register 764 is shown coupled to the unit 750 through the mask register output 736. The column decoder 763 is shown to receive the address bus 706 and to output the column decoder output 738 to the output select 782. The control circuit 770 outputs various control signals to the remaining structures shown in FIG. 1. The column decoder 763 generates the output select input 738, from the address on the address bus 706, for use by the output select 782 whereas the column decoder 762 generates a column select, from the address on the bus 706, for use by the unit 750, and couples the same onto the column decoder output 734. Similarly, the decoder 760 generates a row select to the unit 750 and couples the same onto the row decoder output 732. The combination of the row and column outputs, generated by the decoder 760 and the decoder 762, select a page to be accessed in the device 700, as known to those skilled in the art.

The decoder 762 selects a page within a row and the decoder 763 selects a data unit within the page to be accessed.

In various embodiments, read operations are performed in various modes, such as flow-through mode, registered output mode, or pipelined mode. In flow-through mode, the data that is read is coupled onto the DO 704 (also referred to herein as "data is returned") in the same clock cycle as the cycle in which the command is issued, and in the case of a burst operation, subsequent data is returned in subsequent clock cycles thereafter. This, the first data unit of the burst is returned in the same clock cycle as the cycle in which the command is issued, the second or next data unit of the burst is returned in the next clock cycle and so forth.

In registered output mode, data is returned in the clock cycle after the command is issued and in the case of burst operation, subsequent data units are returned in subsequent cycles thereafter. In pipelined mode, the data unit is returned after a pipeline latency delay, which is a predetermined number of clock cycles, as known to those in the art, and in the case of burst operations, subsequent data units are returned in subsequent cycles thereafter. The registered output mode may be considered a special case of the pipelined mode with a latency of zero. In pipelined mode, if the latency is one or more clock cycles, the bsy* 707 signal is optionally asserted (or active) during the cycle in which the command is issued (received at CNTL 708) and de-asserted in the cycle before the first data unit is returned and remains de-asserted (or inactive) in the case of burst operations for the remainder of the burst. Without loss of generality, the burst read operation is described herein for the case of registered output mode with the understanding that the embodiments and methods discussed and shown herein apply to the remaining modes and any other mode.

The mask register 764 determines whether or not to override data or any portions thereof when write data are being written to the unit 750 by causing circuitry within the unit 750 to inhibit or allow—data units, included in the write data, to be stored in the unit 750. Accordingly, the mask register output 736 is generated by the register 764 for use by the unit 750 to enable or inhibit data units of write data, as will become more evident shortly. Accordingly, the mask register output 736 carries a write mask from the register 764 to the unit 750 for determining which data units of the write data, if any, are inhibited. It is contemplated that the circuitry inhibiting and/or enabling bits of data may be located externally to the unit 750.

The CLK 705 is a clock used to synchronize certain signals of the device 700. The device 700 receives commands, such as burst read and write commands, coupled onto the CNTL 708, and the control circuit 770 decodes the same and provides the requisite signals to the remaining structures of the device 700 through the bus 710.

The device 700 receives a read command, from the CNTL 708, requiring accessing of a location within the unit 750 to be read. The address comprises a row address and a column address. The row address identifies the row in which the location within the unit 750 is to be accessed and it is generated by the row decoder 60 from the address received from the address bus 706. The row decoder 760 selects the row to be accessed within the unit 750 (the selected row) and provides the same, through the output 732, to the unit 750. Similarly, the address from the address bus 706 is used by the column decoder 762 to select the page that is being addressed or accessed. The addressed page is read and loaded into the data latch 780.

The data latch 780 generate the data latch output 744 for use by the corrector 810, which generates the corrector output 748 based on information from the control 728. The output 748 is provided as input to the data buffer 786, which generates the data buffer output 772 to the output select 782, based on information coupled onto the control 726.

The column decoder 763 selects the data unit, of a burst of data, being addressed within the output select 782 and the selected data unit is then coupled onto the DO 704.

In some embodiments, the data access delay is 0 clocks though in other embodiments, any amount of delay is anticipated. Data access delay is the delay, measured in clocks, required to select the addressed data unit at the output select 744 and to couple it onto the DO 704.

When a burst write command is received by the unit 750, the write mask register 766, which is coupled to the auxiliary write mask register 768, is reset. The first data unit of the received burst is clocked into the data buffer 786, using the clock cycles of the CLK 705, and the corresponding bit in the register 766 is set. Subsequent data units of the burst are clocked into the data buffer 786 and the corresponding bit in the register 766 is set in clock cycles thereafter. Concurrently the unit 750 is accessed and the addressed page is read and loaded into the data latch 780 which generates the data latch output 744 for use by the corrector 810, which generates the corrector output 748. The output 748 is loaded into data buffer 786 (where the corresponding write mask bit is not set) and subsequently the bits corresponding to corrected data units (if any) in the corrector output 748 are set in the register 766.

When the last data unit of the burst, including any other data within the page of which the burst is a part, is received, the contents of the data buffer 786 is provided to encoder 840, the encoder output 774 is saved in the write buffer 784, and the contents of the register 766 are saved in the register 768. The output 776, along with the output of the register 768, is sent to the unit 750 and a write operation of the unit 750 is initiated. During a burst write operation, all of the data units of output 746 where the corresponding write mask in output 736 is set are written to the unit 750, and another burst command can be received. That is, the encoder 840 receives its input from the data buffer, as coupled onto the output 772, and generated the encoder output 774, based on information coupled onto the output 724. The output 774 is provided as input to the write buffer 784, which generates the write buffer output 776.

The device 700 advantageously allows for writing to the unit 750, a burst of data, while another write command of a burst of data is being received by the data buffer 786 because the burst write operation is overlapped with receipt of the a subsequent burst of data. Similarly, a corrected burst of data may be read while a burst write operation is in progress. Whereas, in prior art techniques, another command cannot be issued until the write operation is completed, which is typically signaled by a busy signal being asserted after the command is issued and deasserted in the last cycle of the write operation so as to inhibit issuing a command until the write operation is completed. Thus, the device 700 allows for faster burst write operations of a magnetic memory than that which is currently available. In accordance with various embodiments of the invention, during a write operation, all of the data units within a burst of data (along with any corrected data units and the parity) are written to the array 752 in one array write operation. This helps to optimize the time that is required to complete a burst write operation since array write access typically requires more time to complete than an array read access.

Moreover, the number of clock cycles used to complete a burst write operation is approximately the same as those required to complete a read operation, therefore rendering the device 700 to emulate SRAM and/or DRAM performance.

Figure 2:
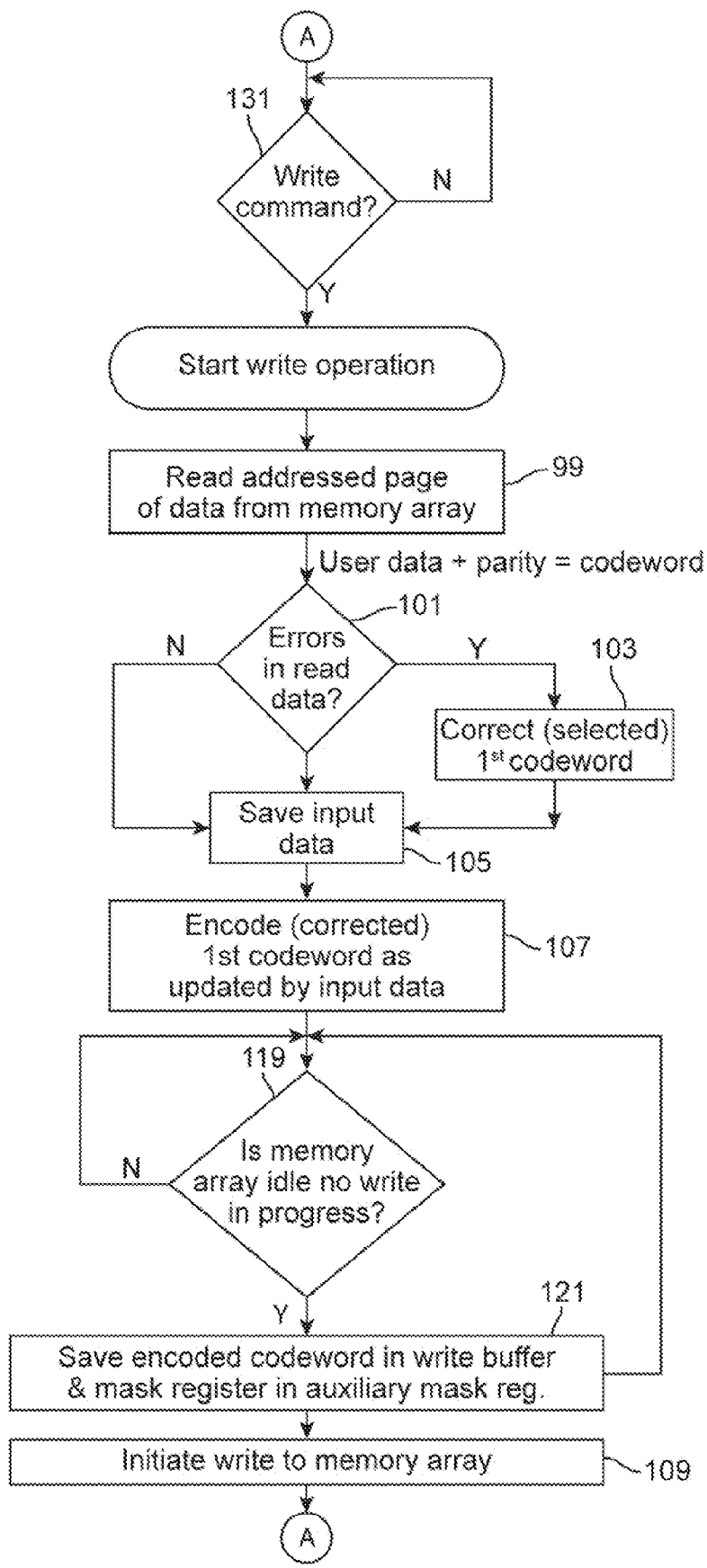
FIG. 2 shows a flow chart of the steps performed by the device 700, in accordance with an exemplary method of writing codewords to the array 752.
Figure 3:
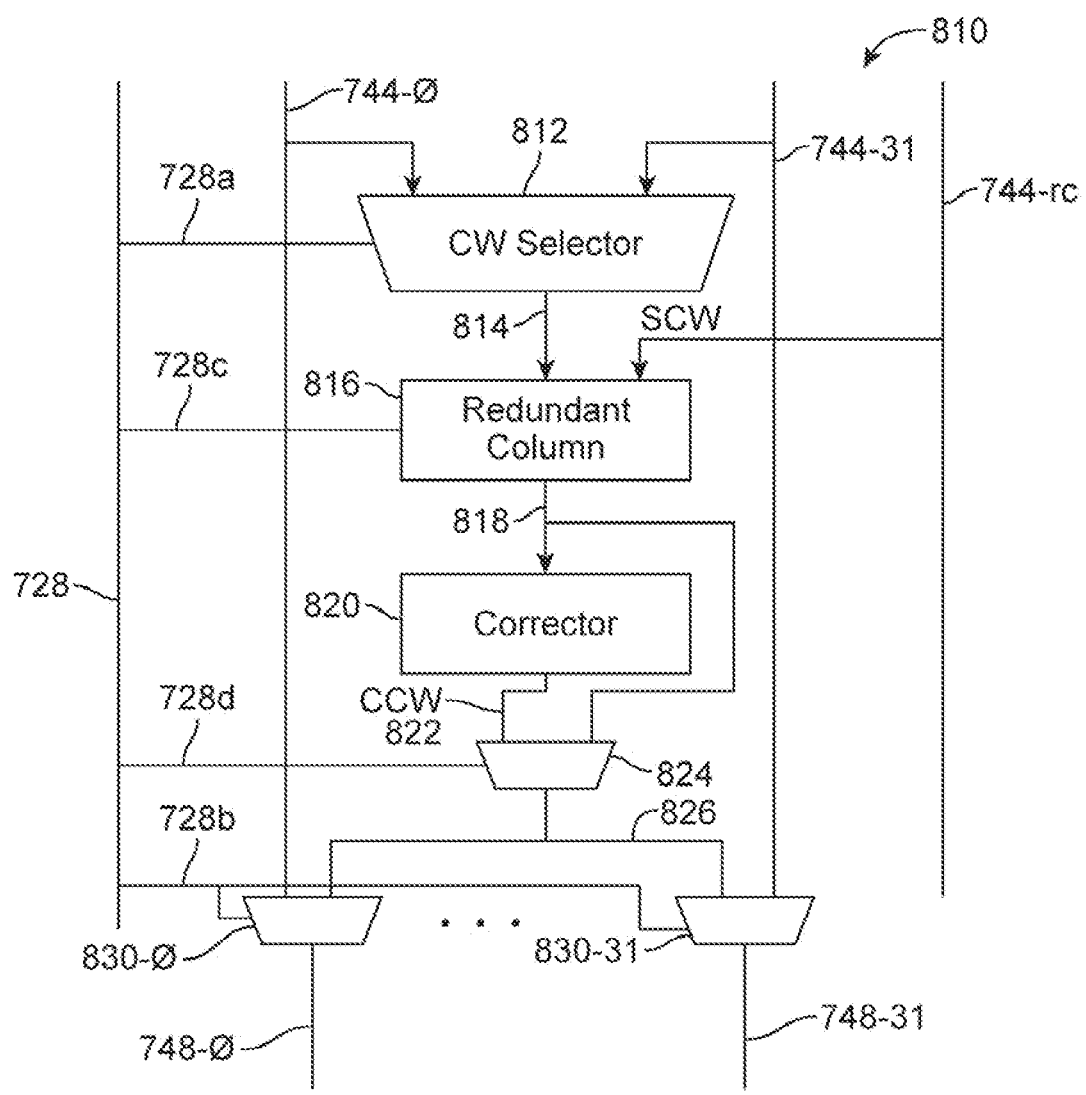
FIG. 3 shows further details of the codeword (CW) corrector 810 of the memory device of FIG. 1, in accordance with another embodiment of the invention.

FIG. 2 shows the steps performed during a write operation by the device 700 of FIG. 1, in accordance with an exemplary method of the invention in which case the burst is completely within one codeword. It is obvious to one skilled in the art to extend this method to cases where one or more bursts cross one or more codeword boundaries. At 131, it is determined that a write command has been received and if a write command is issued, start the write operation by receiving user data in data buffer 786. During the write operation, at step 99, if the addressed page is not in data latch 780 the addressed page is read from the memory array 752 and saved in the data latch 780 (if a write was in progress, the write is aborted, the read is performed and the aborted write re-initiated) and includes at least one codeword having overhead and user data. The data latch 780 couples the page that is read from the array 752 onto the data latch output 744. Next, the first addressed (or "selected") codeword is selected by the CW selector 812 (FIG. 3). Next, at 101, if errors are detected in the first addressed codeword, which is referred to as the first codeword to distinguish it from another codeword, at step 103, the CW corrector 810 corrects the first codeword and sends the corrected page to the data buffer 786 through the output 748. If no correction is required, i.e. no errors found, no correction is done by the corrector 810 and the page is passed through.

Concurrently the data from the DI 702 is being received and saved in the data buffer 786 and corresponding bits in mask register 766 are set. At step 105, the data units in corrector output 748 corresponding to the data units not updated by user (corresponding bits in the mask register are reset) is loaded in data buffer 786. Next, at step 107, after the last data unit of the burst is received the CW encoder 840 encodes the first codeword as updated by data received from the DI 702. Next at step 119 a determination is made as to whether or not the array 752 is idle or not. "Idle" refers to no operation to the memory array 752 being in progress. The process remains at step 119 until the array 752 is idle. If the memory array is idle, the process continues to step 121 where the encoded codeword (first CW) is saved in the write buffer 784 and the contents of the mask register 766 are saved in the auxiliary mask register 768 after which, at step 109, write of write data 776 to memory array 752 is initiated and the process returns to 131. The corresponding write mask 736 advantageously enables writing of data units that have been corrected or updated and the codeword parity while the write operation to the array 752 is in progress.

Advantageously, a second write operation can be initiated where another page is accessed in the array 752 and is provided as input to the data latch 780 through the input 742, and the steps repeated up to the step 119. The step 109 is performed after the first write operation to the array 752 is completed, the data and mask associated with the first write operation are saved in the write buffer 784 and the auxiliary mask register 768, at step 121, and are not changed while the first write operation to the array 752 is in progress and while the second write operation is being processed.

FIG. 3 shows further details of the CW corrector 810 of the device 700, in accordance with embodiment of the invention. The corrector 810 is shown to include a CW selector 812, a redundant column selector 816, a corrector 820, a selector 824, and the selectors 830_0 through 830_31. The CW corrector 810 is shown to receive the output 744, including its 32 codewords 744_0 through 744_31, as well as one of the control signals of the control input 728, i.e. 728a, and to generate the CW selector output 814 to the selector 816. The selector 812, based on the state of the input 728a, selects one of the codewords 744_0 through 744_31.

Among the output 744 is a redundant column output 744_rc, having a replacement column addressed coupled thereon, addressing a column substituted for a defective column. Accordingly, the selector 816 uses the output 744_rc, based on the state of the control 728c, to replace the defective bits of the output 814 to provide, as the redundant column selector output 818 to the corrector 820. That is, if the output of the selector 812 includes bits that are defective, the selector 816 selects from the output 744_rc to provide a replacement for the defective bits. The defective columns are identified during manufacturing and defect information are stored in device 700 and provided via control 728c. The corrector 820 receives, as its input the output 818 and corrects errors, if any, therein and outputs the corrected codeword 822 to the selector 824.

The corrector 820, in some embodiments of the invention, is optional and can be bypassed with no correction performed. In cases where corrector is bypassed, the selector 824 chooses the output 818, otherwise, in cases where corrector is not bypassed, the corrected output 822 is selected by the selector 824. Another selection is made by the selectors 830_0 through 830_31, between codewords 744_0 through 744_31 and the corrected codeword 826. The codeword corresponding to selected code word is replaced by corrected codeword 826 while the other codewords are passed through in that either the output 744_0 through 744_31 is selected as the output of the corrector 810 or the corrected codeword 826 is selected as output of the corrector 810 by the selectors 830_0 through 830_31 based on control 728b. The output of the selectors 830_0 through 830_31 form the outputs 748_0 through 748_31, respectively, with the latter making up the output 748.

Figure 4:
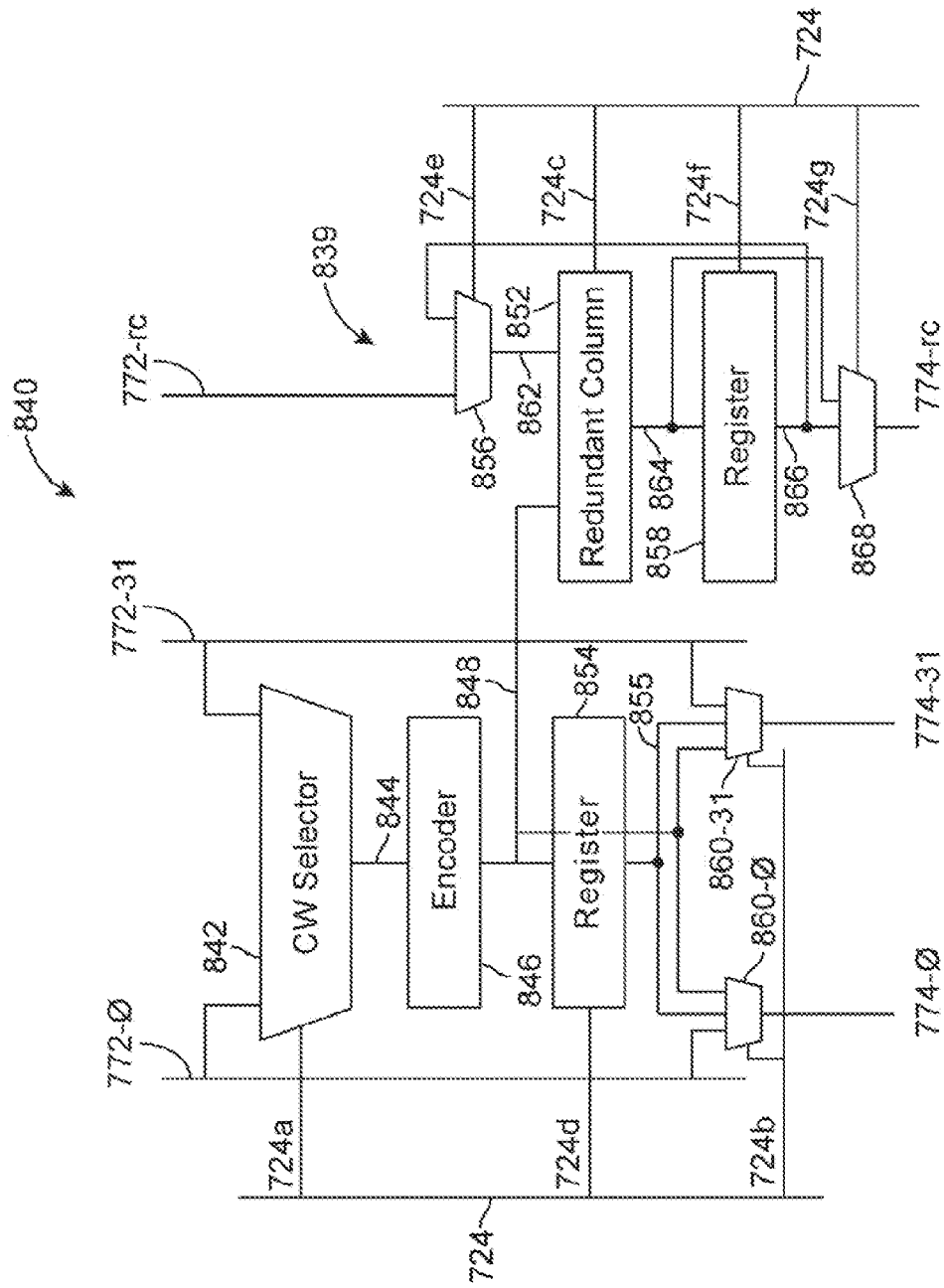
FIG. 4 shows further details of the codeword (CW) encoder 840 of the memory device of FIG. 1, in accordance with an embodiment of the invention.

FIG. 4 shows further details of the CW encoder 840 of FIG. 1, in accordance with another embodiment of the invention. The encoder 840 is shown to include a CW selector 842, an encoder 846, a register 854, selectors 860_0 through 860_31, selector 856, redundant column selector 852, a register 858, and a selector 868. The selector 856, the redundant column selector 852, the register 858, and the selector 868 comprise a redundant column encoder 839.

The selector 842 is shown to receive the output 772, codewords 772_0 to 772_31, and to generate a selector output 844 for use by the encoder 846. The selector 842 basically selects one of the codewords 772_0 to 772_31. The encoder 846 encodes, in accordance with a known ECC technique, the output 844 and couples the same onto the encoder output 848, which is also provided to the selectors 860_0 through 860_31 and to the register 854. The selector 842 selects based on the state of the output 724a.

The register 854 also receives as input the control 724d, which along with the control 724a and 724b are a part of the control 724. The register 854 output the register output 855 to the selectors 860_0 through 860_31. The function of register 854 is further discussed hereinbelow. The selectors choose between the register output 855, the encoder output 848, or the output 772, based on the state of the control 724b, and provide the selected input as output onto the output 774. The selector 856 receives as input, the output 772_rc, which is the redundant column substitution, in place of a defect in a column being accessed, that is provided as input to the selector 856 to be used for replacing defective column. In this respect, the selector 856 receives another input, the output of the register 858, and chooses between the latter and the output 772_rc to generate its output based on the state of the control 724e, which is a part of the control 724.

The redundant column block 852 receives as input, the output of the selector 856 and further receives the output of the encoder 846 as input and generates the output 864, used by the register 858 and by the selector 868. The function of register 858 is discussed hereinbelow. The output of the register 858, output 866, is provided to the selector 868, which chooses between the latter and the output 864, based on the state of the control 724g, to generate the output 774_rc.

To summarize, the array 752 is made of rows and columns with a row having a number of pages. In the exemplary embodiments presented herein a row is made of 16 pages, a page includes 32 codewords, a codeword comprises 8 data units, and each data units comprises 16 bits. Additionally up to 8 columns, among the columns assigned to one of the 16 bits of data units can be replaced with a redundant column, for a total of 128 repairable columns. It is understood that other embodiments can have a different number of pages per row, or codewords per page, or data units per codeword, or bits per data unit or redundant columns. All such embodiments fall within the scope of the invention.

The various embodiments of the invention presented herein include embodiments where replacement of a defective column is performed within the unit 750 allowing the output of the unit 750, i.e. output 742, to be defect free. It is understood however, that this replacement may be done outside of the unit 750.

The embodiments of the invention include an embodiment with a Synchronous RAM (SRAM)-like memory interface and a Synchronous DRAM-like memory interface. SRAM-like memory interface is now described.

Used as a synchronous SRAM-like memory interface, the device 700 comprises the CLK 705, the Add 706, the DI 702, the DO 704, and the CNTL 708 comprising of a chip enable; CE* 708a, and a write enable; WE* 708b. The interface may optionally include a bsy* signal indicating the memory is busy executing a command and commands can not be issued until bsy* 707 is de-asserted. Other embodiments with additional signals and or different signals that provide similar functionality as embodiments of present invention fall within the scope of invention.

In some embodiments, all commands are defined by states of control signals CE* 708a, and WE* 708b at the rising edge of the CLK 705. Additionally the memory supports (fixed) burst operation, wherein the read or write operates on a fixed size burst. For example the burst size can be 2, or 4 data units.

Without loss of generality, the operations will be described for burst access (burst read, burst write)

Modes of Operation

The unit 700 can take on various modes of operations, described as follows.

Test mode: Test mode is for testing the memory typically after fabrication in the manufacturing process. This mode, among other features for testing the device, access to all rows and columns of the array 752 to identify defective rows and columns and if the defective rows and columns does not exceed the number of spare rows and columns to replace defective rows and columns with spare rows and columns.

User mode: in user mode, the (defective rows and columns have been replaced by spare rows and columns) and the parity is transparent to the user. For example assuming a single error correction (SEC) with codeword size 128 bits (data size 120 bits, and parity size 8 bits) the user can only access data with parity generation, parity storage, and data correction remaining transparent to the user.

ECC Bypass mode (also referred to herein as "ECC Test mode"): ECC bypass mode is analogous to the user mode described above, except that parity bit access is allowed by the user and ECC generation and correction can be independently enabled or disabled or bypassed. In this mode, defective rows and columns are replaced by spare rows and columns and the parity bits can be accessed.

FIGS. 5 through 7b show timing diagrams of various exemplary read and/or write operations within the unit 700.

Burst Read Operation

The read operates in flow through mode, registered output mode, or pipelined mode. In flow through mode the return data is coupled on DO 704 in the same cycle as the command was issued, and in case of burst operation subsequent data are returned in subsequent cycles thereafter, that is the first data is returned in same cycle as the command was issued, second data in the next cycle and so forth. In registered output mode, the data is returned in the cycle after the command is issued, and in case of burst operation subsequent data are returned in subsequent cycles thereafter. In pipelined mode, the data is returned after a pipeline latency delay (the pipeline delay is defined in terms of clock cycles) and in case of burst operation subsequent data are returned in subsequent cycles thereafter. The registered output mode maybe considered a special case of pipeline mode with latency of zero. In pipeline mode if the latency is one or more cycles the (optional) bsy* 707 signal is asserted during the cycle the command is issued and de-asserted in the cycle before the first data is returned, and in case of burst operation remain de-asserted for the remainder of the burst.

The corrector 810, when in flow-through mode or registered output mode is referred to herein as "type 0" corrector. For example, correctors for simple ECC such as SEC or SEC/DED are of type 0. To improve the throughput, the corrector 810 is pipelined to provide output data after an initial latency. The corrector 810 is pipelined such that codewords can be provided as input to the corrector 810 sequentially in subsequent cycles and after the corrector latency corrected codewords are available in subsequent cycles thereafter. Such corrector requires each stage of corrector pipeline to have a latency of one clock for example correctors for simple ECC such as SEC or SEC/DED, such corrector pipeline will be referred to as type I pipeline. For more complex ECC where in the corrector pipeline stages are generally more than one clock cycle and not equal, the subsequent corrector outputs are not available one after another, and such corrector is referred to herein as "type II". Additionally the memory device 700 asserts bsy* 7 in the cycle the command is issued, and bsy* is de-asserted before the first data is returned and in case of burst operation subsequent data are returned in subsequent cycles thereafter.

When a read command is issued (coupled onto the CNTL 708), the array 752 is accessed, a row is selected by row decoder 760 and a page is selected by column decoder 762, the addressed page is read and loaded in data latch 780, and sent to CW Corrector 810. The CW selector 812 selects the addressed codeword 814 within the page.

When the burst is completely within a codeword after correction is completed (the cycle before data is returned and bsy* 707 is de-asserted) the output 748_0 through 748_31 are loaded in the data buffer 786. The column decoder 763 decodes a column address and provides it to the output select 782. The addressed data unit within the data buffer 786 is selected by the output select 782, and coupled onto data out DO 704, and subsequent data are returned in subsequent cycles.

When the burst spans two codewords (a first part in a first codeword and the second part in the second code word) The CW selector 812 selects the first addressed codeword, and next codeword is selected after the latency of first stage of corrector pipeline (next cycle for type 1), after completion of correction of the first codeword, and after going through selects, the output 748 is loaded in the data buffer 786.

For type I corrector pipeline the bsy* is de-asserted, and in the next cycle the next codeword correction is completed and after going through selects, the output 748 is loaded in the data buffer 786. The addressed data unit within the data buffer 786 is selected by column decoder 763, and coupled on data out DO 704, and subsequent data are returned in subsequent cycles.

For type II corrector pipeline after the second codeword correction is done the bsy*707 is de-asserted and after going through selects, the output of the 748 is loaded in the data buffer 786. The addressed data unit within the data buffer 786 is selected by column decoder 763, and coupled on data out DO 704, and subsequent data are returned in subsequent cycles.

Figure 5:
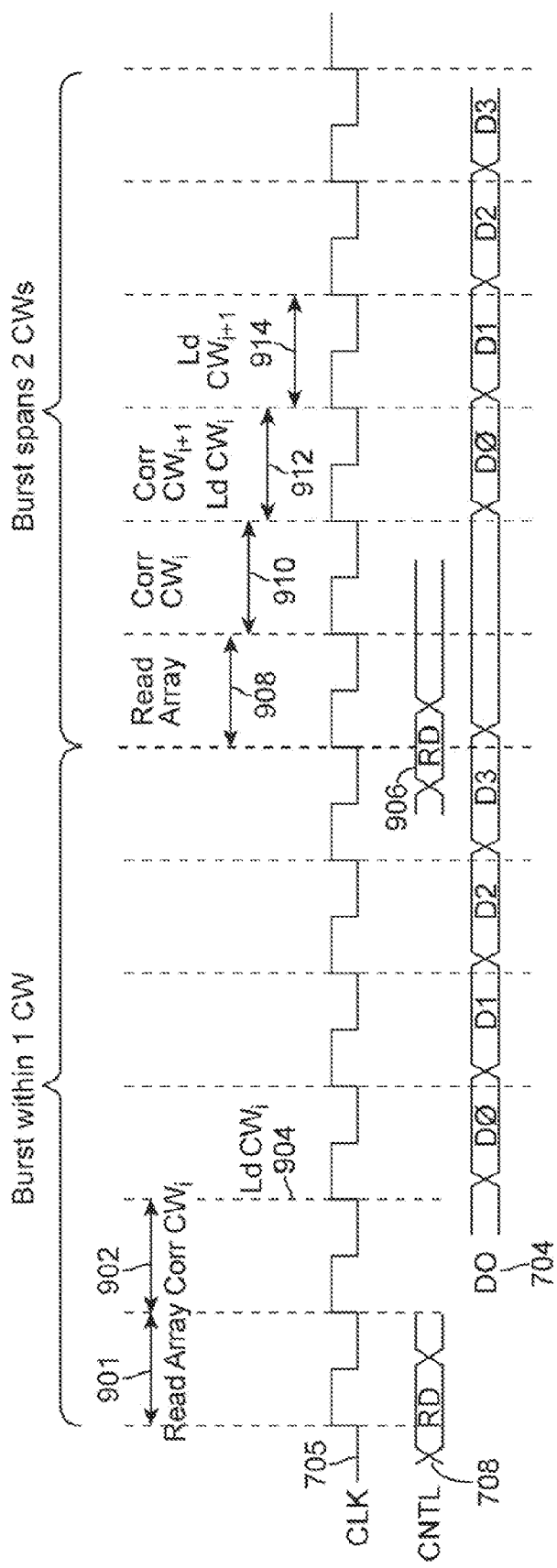
FIG. 5 shows a timing diagram of burst read operation

FIG. 5 shows a timing diagram of the behavior of some of the signals of FIG. 1 when a read command is initiated to read a burst that fall completely within a single codeword, followed by a read command that is initiated to read a burst that spans across two codewords. At 901, upon the first read being initiated, the memory array 752 is read, at 902, the first codeword is corrected and at 904 the corrected codeword is loaded onto the data buffer 772. At 906, the second read is initiated and the memory array 752 is read at 908, the first codeword is corrected at 910 and loaded onto the data buffer 772 during the subsequent cycle, at 912, also the next codeword is corrected is corrected at 912, after which, at 914, the next corrected codeword is loaded in data buffer 772.

Burst Write Operation

Burst write following a Burst write Operation (FIGS. 6a and 6b)

FIG. 6a shows back-to-back burst write operations with a fixed burst size of 4, where read access from the memory array 752 is 1 cycle long, correction is 1 cycle (type 0 corrector) long, and write access to the memory array is 3 cycles long. the next write burst is issued when the last data unit of the burst, to be written, is received or a write access time (in this case 3 cycles) after that (when write to array is completed) since the array is not idle and read can not be performed.

Advantageously, in FIG. 6a, an example of overlapping of the writing of a codeword to the array 752 with the reading and correcting of the next codeword and generating parity for the same is accomplished, which improves performance of the device 700.

In yet another scenario shown FIG. 6b, the next burst write can be issued when last data unit of burst is received or any cycle after that. In this embodiment if the burst write is issued when a write to array is in progress, the write is aborted a read of array for the new burst write is performed and the write is restarted taking same array write access to complete.

In the timing diagrams of FIGS. 6a and 6b, the (fixed) burst size is not greater than the codeword size, therefore a burst at most spans across two codewords. This should not be considered a limitation, as the teaching of the invention applies to larger burst sizes. The burst may completely be in one codeword or span two codewords. In case the burst is completely within one codeword, only one codeword needs to be updated in the write buffer, the parity is generated the later of the cycle receiving the last data unit of burst or the cycle after completion of correction, and the codeword update in write buffer occurs the cycle after parity generation. In any event the write buffer update occurs after complete reception of the burst. In case the burst crosses the codeword boundary it includes a first part in a first codeword and a second part in the codeword after the first, therefore two codewords must be updated in the write buffer. For overlapped write wherein the write to memory array is overlapped with reception of another burst, the contents of write buffer must not be changed during reception of another burst as that content is being written to the array. An object of the invention is to support overlapped write and a CW encoder that does not require changing the write buffer during reception of another burst.

In the case that the burst is entirely in one codeword, the select among the selects 860_0 through 860_31 corresponding to first codeword couples the encoder output 848 on its corresponding output and the other selects couple the corresponding codewords coupled onto 772_0 through 772_31 onto the respective outputs 774_0 through 774_31. Similarly the result of redundant column substitution for the first codeword is on output 864, and the select 868 couples the output 864 on its output.

In case the burst crosses the codeword boundary including a first part in a first codeword and a second part in the second codeword, the first encoded codeword is saved in register 854, the select among the selects 860_0 through 860_31 corresponding to first codeword select output 855, the select among the selects 860_0 through 860_31 corresponding to second codeword select encoder output 848, and the other selects among 860_0 through 860_31 select the corresponding codeword coupled onto 772_0 through 772_31 and couple on the respective outputs 774_0 through 774_31. Similarly the result of redundant column substitution for the first codeword is saved in register 858, the select 856 couples the register output 866 on output 862, and the select 868 couples redundant column output 864 on output 774_rc.

Burst write Operation, burst within one codeword boundary

When a write command is issued, the auxiliary write mask register 766 is reset. The first data unit of the burst on DI 702 is clocked in the data buffer 786 and the corresponding bit in the write mask register 766 is set. The addressed page is read and loaded in a data latch 780. The data latch output 744 feeds the CW corrector 810. Subsequent data units of the burst are clocked in data buffer 786 and the corresponding bit in the write mask register 766 is set in cycles thereafter.

In the next cycle (2nd cycle) the data latch output 744 will be processed in CW corrector 810 wherein the addressed codeword 814 within page is selected and goes through redundant column substitution 816, corrector 820 and selects 824, and 830.

In the cycle after the completion of correction (3rd cycle for type 0 corrector) (or the data units in codeword in the output 748 corresponding to selected codeword) with corresponding write mask bits at logical 0 are loaded in the data buffer 786. The data buffer output 772 feeds the CW Encoder 840. To enable write of corrected data units when the array write is initiated, in the next cycle the bits in write mask corresponding to corrected data units by the corrector are set.

In the latter of the cycle that the last data unit of burst is received or the cycle after completion of correction, the encoder 846 generates the encoded codeword 848 corresponding to the data units in the codeword. The bits in the write mask 766 corresponding to parity bits of the codeword are set. The encoded codeword 848, along with output 862 and redundant column write control 724c are input to redundant column block 852. For the first codeword the select 856 couples redundant column 772_rc on output 862. The redundant column block 852 generates a redundant column output 864 wherein the alternate redundant columns assigned to defective columns within the codeword are assigned the logical values of defective columns within encoded codeword 848, and keeping logical values the of remaining redundant columns within page unchanged. The control 724_c provides information about defective columns within codeword and the alternate redundant column assigned to the defective columns.

The select among the selects 860_0 through 860_31 corresponding to first codeword couples the register output 848 on its corresponding out and the other selects couple the corresponding codewords 746_0 through 746_31 onto the respective outputs 774_0 through 774_31. The select 868 couples output 864 on output 774_rc.

In the next cycle set (5th cycle for type 0 corrector and burst size 4) the CW Encoder output 774 is loaded in write buffer 784 and the write mask register 766 is loaded in auxiliary write mask register 768. Note the next burst (read or write) could be started in this cycle, and an array read initiated.

In the next cycle the write data 776 along with auxiliary write mask register 768 is sent to array 752 and write to array 752 is initiated. The write mask will enable write of addressed data unit and updated parity to array, inhibiting write to the rest of page in the array.

Burst Write Operation, Burst Crossing Codeword Boundary

In the timing diagrams of FIGS. 6a and 6b, the burst spans two codewords, a first part comprising 1 data unit in a first codeword and the second part comprising 3 data units in the second code word, this is an example and other sizes for burst, first part and second part falls within scope of the invention.

When a write command is issued, the write mask register 766 is reset. The first data unit of the burst on DI 702 is clocked in the data buffer 786 and the corresponding bit in the write mask register 766 is set. The addressed page is read and loaded in data latch 780. The data latch output 744 feeds the CW corrector 810. Subsequent data units of the burst are clocked in data buffer 786 and the corresponding bit in the write mask register 766 is set in cycles thereafter.

In the second cycle the data latch output 744 will be processed in CW corrector 810. When the burst spans two codewords the CW selector 812 selects the first addressed codeword of the burst, and next codeword is selected after the latency of the first stage of corrector pipeline (next cycle for type 0 corrector).

In the cycle after the completion of correction of the first codeword (in this example, 3rd cycle for type 0 corrector) the data units in codeword in the output 748 corresponding to first selected codeword with corresponding write mask bits at logical 0 are loaded in the data buffer 786. The data buffer output 772 feeds the CW Encoder 840. In the next cycle, the bits in write mask register 766 corresponding to corrected data units by the corrector are set.

In the latter of the cycle that the last data unit of the first codeword is received or the cycle after completion of correction of the first codeword (in this example, 3rd cycle for type 0 corrector) the encoder 846 generates the encoded codeword 848 corresponding to the data units in the first codeword. The bits in the write mask 766 corresponding to parity bits of the codeword are set. The encoded codeword 848, along with output 862 and redundant column write control 724c are input to redundant column 852. The redundant column 852 generates a redundant column output 864 wherein the alternate redundant columns assigned to defective columns within the codeword are assigned the logical values of defective columns within encoded codeword 848, and keeping logical values the of remaining redundant columns within page unchanged. In the next cycle (4th cycle for type 0 corrector) the output 848 is loaded in register 854, and output 864 is loaded in register 858.

In the cycle after the completion of correction of the second codeword (in this example, 4th cycle for type 0 corrector) the data units in the codeword in the output 748 corresponding to the second selected codeword with corresponding write mask bits at logical 0 are loaded in the data buffer 786. The data buffer output 772 feeds the CW Encoder 840. In the next cycle, the bits in write mask register 766 corresponding to corrected data units by the corrector are set.

In the latter of the cycle that the last data unit of burst is received or the cycle after completion of correction of the second codeword, the encoder 846 generates the parity bit corresponding to the second codeword, and the bits in the write mask register 766 corresponding to parity bits of the codeword are set (4th cycle for type 0 corrector)

The select among 860_0 through 860_31 corresponding to first codeword select output 855, the select among 860_0 through 860_31 corresponding to second codeword select output 848, and the other selects among 860_0 through 860_31 select the corresponding codeword 772_0 through 772_31 and couple on the respective outputs 774_0 through 774_31. The select 868 selects output 866 and couple on the output 774_rc.

In the next cycle set (5th cycle for type 0 corrector and burst size 4) the CW Encoder output 774 is loaded in write buffer 784 and the write mask register 766 is loaded in the auxiliary write mask register 768. The select 788 couples write buffer output 784 on to array write data 746. Note if the next burst (read or write) is started in this cycle, the array write is delayed and an array read initiated.

In the next cycle the write data 776 along with auxiliary write mask register 768 is sent to array 752 and write to array 752 is initiated. The write mask will enable write of addressed data unit and updated parity to array, inhibiting write to the rest of page in the array.

The various embodiments of the invention are presented for a fixed-sized burst. The invention can be applied to cases were the burst size is variable (the size of burst is not known prior to the start of burst)

Burst read following a Burst write Operation (FIG. 7a, 7b)

FIG. 7a shows a timing diagram of a burst read operation following a burst write operation with a fixed burst of 4, where read access from the memory array is 1 cycle, correction is 1 cycle (type 0 corrector), and write access to the memory array is three cycles. In FIG. 7a, the read to array is issued when the last data unit of burst is received, if the read is to a different page the write to array is delayed and instead a read of array is performed and the write to array occurs during the next cycle. The read data is clocked out while the write to array is in progress.

In yet another scenario shown in FIG. 7b the next burst read can be issued when the last data unit of burst write is received or any cycle after that. In this embodiment if the burst read is issued when a write to array is in progress, and the read is to a different page the write is aborted, a read of array for the new burst read is performed and the write is reinitiated. The read data is clocked out while the write to array is in progress.

If either the first and/or the second codeword (in the case where the burst crosses the codeword boundary) being accessed are part of write burst in progress the control 726 selects the write data 776 to be loaded in data buffer 786. This is for data coherency check to avoid stale data returned.

DRAM like Memory Interface

Operation for DRAM like interface is very similar to SRAM operation and will be obvious to one skilled in the art. The main difference is that burst operations to a different page is preceded by an ACTIVATE command, the burst read or write command can be issued tRCD cycle after ACTIVATE. The ACTIVATE command initiates accessing the array to read the addressed page and loading into data latch followed by correction and loading in the data buffer. Back to back burst commands to different pages does not require aborting/resuming write as the write can be completed prior to initiating read as explained in the co-pending U.S. patent application Ser. No. 13/303,947, entitled "MAGNETIC RANDOM ACCESS MEMORY WITH DYNAMIC RANDOM ACCESS MEMORY (DRAM)-LIKE INTERFACE", filed on Nov. 23, 2011, by Siamack Nemazie.

Write with Read Verify

In yet another embodiment after writing the data buffer write along with write mask to the array, the array is read and loaded in the data latch, and compared against the write buffer, if a mismatch occurs the write will be retried (optionally with a different setting)

In yet another embodiment after writing the data buffer write along with write mask to the array, the array is read and loaded in the data latch, and compared against the write buffer, and a count of the number of mis-compares per codeword generated if any such count exceeds a predefined threshold the write will be retried (optionally with a different setting).

Figure 8:
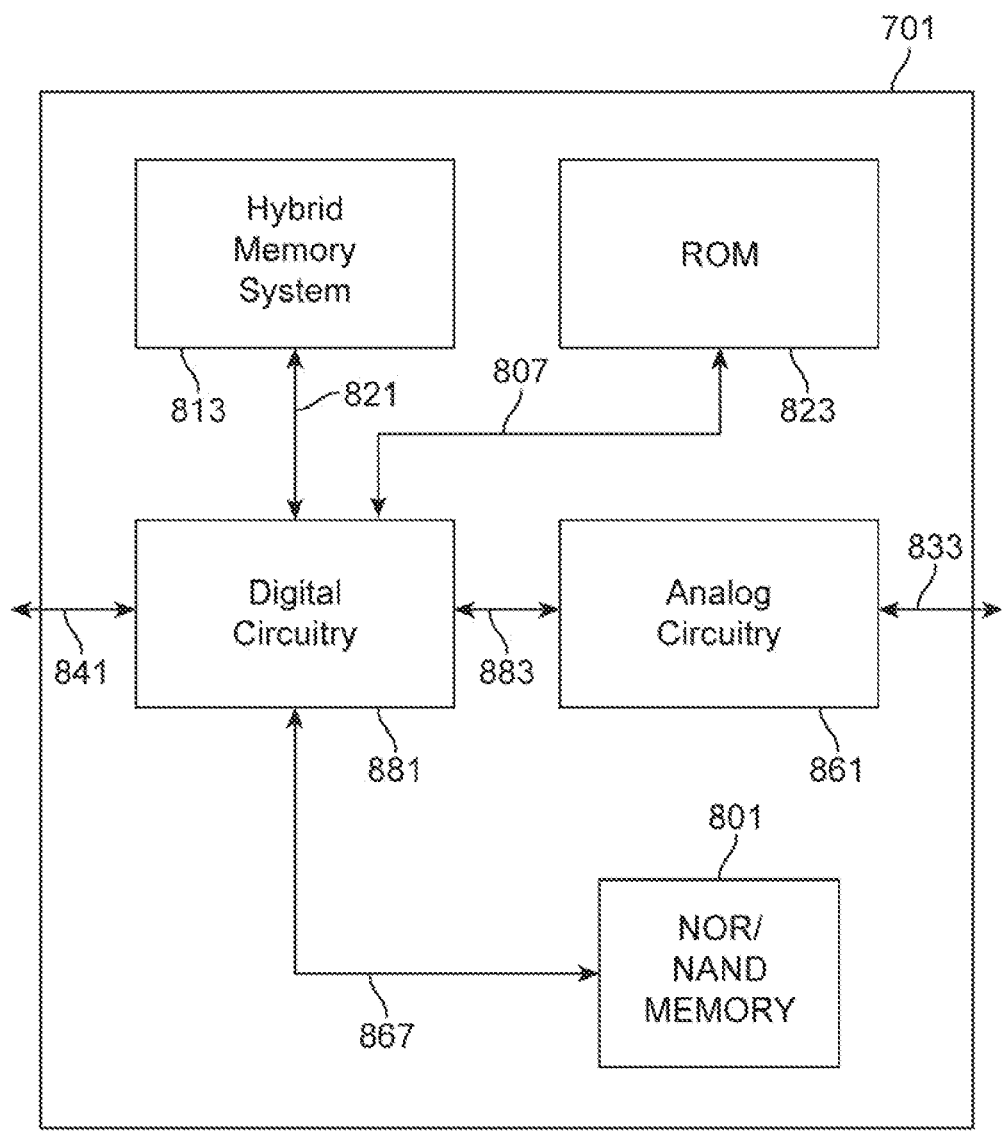
FIG. 8 shows a block diagram of an apparatus 701, in accordance with an embodiment of the invention.

FIG. 8 shows a block diagram of an apparatus 701 incorporating a hybrid memory system 813, which, in some embodiments includes a combination of magnetic memory, analogous to the magnetic memory device 700, and non-volatile memory (such as static random access memory (SRAM) or dynamic random access memory (DRAM)), and in other embodiments is made of magnetic memory, in its entirety. The apparatus 701, which is understood as being an exemplary application with many others being contemplated, is shown to include a digital circuitry 881 (comprising a micro processor) coupled to the system 813, and a ROM 823 and an analog circuitry 861 (comprising power on reset generator, low power voltage detect, and a voltage regulator) and a NOR/NAND memory 801. The NOR/NAND memory 801 is another form of memory used to store data. Additionally the analog circuitry 861 transmits and receives analog data 833 and converts the analog data to digital form for use by the digital circuitry 881 through the digital data 883. The memory 801 receives digital circuitry output 867 from the digital circuitry 881.

The ROM 823 is yet another form of memory used to store data during manufacturing of the apparatus 701 and whose contents are read through the signals 807. The system 813 communicates data through the signals 821 to and from the digital circuitry 881. The apparatus 701 transmits and receives information through the interface 841, and the analog data 833. In some embodiments, the digital circuitry 881 is a microprocessor although other digital circuitry in addition thereto or in replacement thereof is contemplated.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A memory device configured to correct errors comprising:
    a data latch responsive to an addressed page of data from a memory array and operative to generate a data latch output;
    a codeword corrector responsive to the data latch output, the data latch output including a first codeword, the codeword corrector operative to correct errors, if any, in the first codeword and generate a codeword corrector output including a corrected first codeword;
    a data buffer responsive to the codeword corrector output and a first user data associated with the addressed page provided by a user of the memory device and operative to generate a data buffer output including the corrected first codeword, as modified by the first user data, defined as a first codeword output;
    a codeword encoder responsive to the data buffer output and operative to encode the first codeword output to generate an encoded first codeword output included in a codeword encoder output; and
    a write buffer responsive to the codeword encoder output and configured to save the received codeword encoder output and to provide a write data to the memory array, wherein providing the write data to the memory array is performed while receiving a second user data, the second user data having a second codeword associated therewith, and correcting the second codeword.

2. The memory device of claim 1, responsive to commands including burst commands configured to correct errors.

3. The memory device of claim 1, wherein each page includes at least one data unit, the memory device further including a write mask having a mask bit associated with each data unit, wherein during a write operation to the memory array, writing of data units to the memory array is enabled based on the state of corresponding mask bits.

4. The memory device of claim 1, wherein the codeword corrector includes a codeword selector and a corrector, the codeword selector operative to receive the data latch output, including a plurality of codewords, and to select the first codeword from the plurality of codewords, the corrector operative to correct errors, if any, in the first codeword, the corrector operative to generate a corrector output.

5. The memory device of claim 4, wherein the codeword encoder includes a codeword selector and an encoder, the codeword selector being operative to select the first codeword output, the encoder operative to encode the selected first codeword and first user data and to encode the same into an encoder output.

6. The memory device of claim 5, wherein the codeword encoder further includes a redundant column block responsive to the encoder output and operative to replace an address of a column identifying the column within the memory array associated with the encoder output with a replacement column address in the case where the address is defective.

7. The memory device of claim 1, wherein the memory array is made of magnetic random access memory.

8. The memory device of claim 1, wherein the memory array is made of spin torque transfer magnetic random access memory.

9. The memory device of claim 1, wherein the first user data is within a single codeword.

10. The memory device of claim 1, wherein the first user data spans multiple codewords.

11. The memory device of claim 1, wherein the second user data is within a single codeword.

12. The memory device of claim 1, wherein the second user data spans multiple codewords.

13. The memory device of claim 1, wherein memory device is a DRAM-like interface.

14. An apparatus comprising:
    digital circuitry responsive to digital information;
    analog circuitry coupled to the digital circuitry and responsive to analog information;
    a memory device, coupled to the digital circuitry, and having a magnetic memory unit made of a plurality of memory cells organized in an array of rows and columns, rows comprising of plurality of pages that store codewords, the memory device configured to correct errors during write and read operations to a memory array and comprising:
        a data latch responsive to an addressed page of data from a memory array and operative to generate a data latch output;
        a codeword corrector responsive to the data latch output, the data latch output including a first codeword, the codeword corrector operative to correct errors, if any, in the first codeword and generate a codeword corrector output including a corrected first codeword;
        a data buffer responsive to the codeword corrector output and a first user data associated with the addressed page provided by a user of the memory device and operative to generate a data buffer output including the corrected first codeword, as modified by the first user data, defined as a first codeword output;
        a codeword encoder responsive to the data buffer output and operative to encode the first codeword output to generate an encoded first codeword output included in a codeword encoder output; and
        a write buffer responsive to the codeword encoder output and configured to save the received codeword encoder output and to provide a write data to the memory array,
        wherein providing the write data to the memory array is performed while receiving a second user data, the second user data having a second codeword associated therewith, and correcting the second codeword.

15. An apparatus, as recited in claim 14, further including a NOR/NAND memory coupled to the digital circuitry.

* * * * *